United States Patent [19]

Maruyama

[11] Patent Number: 5,483,485
[45] Date of Patent: Jan. 9, 1996

[54] NONVOLATILE SEMICONDUCTOR SYSTEM WITH AUTOMATIC OVER ERASE PROTECTION

[75] Inventor: Akira Maruyama, Suwa, Japan

[73] Assignee: Seiko Epson Corporation, Japan

[21] Appl. No.: 150,051

[22] PCT Filed: Mar. 25, 1993

[86] PCT No.: PCT/JP93/00362

§ 371 Date: Nov. 18, 1993

§ 102(e) Date: Nov. 18, 1993

[87] PCT Pub. No.: WO93/19470

PCT Pub. Date: Sep. 30, 1993

[30] Foreign Application Priority Data

Mar. 25, 1992 [JP] Japan .................................. 4-67012

[51] Int. Cl.$^6$ ............................................ G11C 7/00
[52] U.S. Cl. ...................... 365/185.18; 365/185.12; 365/185.29; 365/185.27; 365/185.26
[58] Field of Search ................................ 365/218, 185, 365/900, 184

[56] References Cited

U.S. PATENT DOCUMENTS

| | | | |
|---|---|---|---|
| 4,797,856 | 1/1989 | Lee et al. ....................... | 365/218 |
| 5,051,953 | 9/1991 | Kitazawa et al. ............... | 365/185 |
| 5,097,446 | 3/1992 | Shoji et al. ..................... | 365/218 |
| 5,315,547 | 5/1994 | Shoji et al. ..................... | 365/218 |

FOREIGN PATENT DOCUMENTS

| | | |
|---|---|---|
| 1-294297 | 11/1989 | Japan . |
| 4-21998 | 1/1992 | Japan . |
| 4-13295 | 1/1992 | Japan . |

*Primary Examiner*—David C. Nelms
*Assistant Examiner*—Vu A. Le
*Attorney, Agent, or Firm*—Oliff & Berridge

[57] ABSTRACT

The present invention has an object to prevent an overerasing in a flash EEPROM. In memory transistors (1)–(4), the source line SL is set at Vpp and word line WL1 and WL2 are set at a predetermined voltage, thereby performing an erasing operation. In such a case, a set voltage lower than that of the control gate electrode in each of the memory transistors (1)–(4) is applied to the drain region of the same memory transistor. As the erasing operation proceeds to reduce the threshold voltage to a sufficiently low level, any one of the memory transistors (1)–(4) is turned on so that the voltage in the source line SL is pulled down toward the set voltage in that memory transistor. As a result, the threshold voltage in that memory transistor can be detected to prevent the overerasing before the memory transistor reaches its over-erased slate.

15 Claims, 10 Drawing Sheets

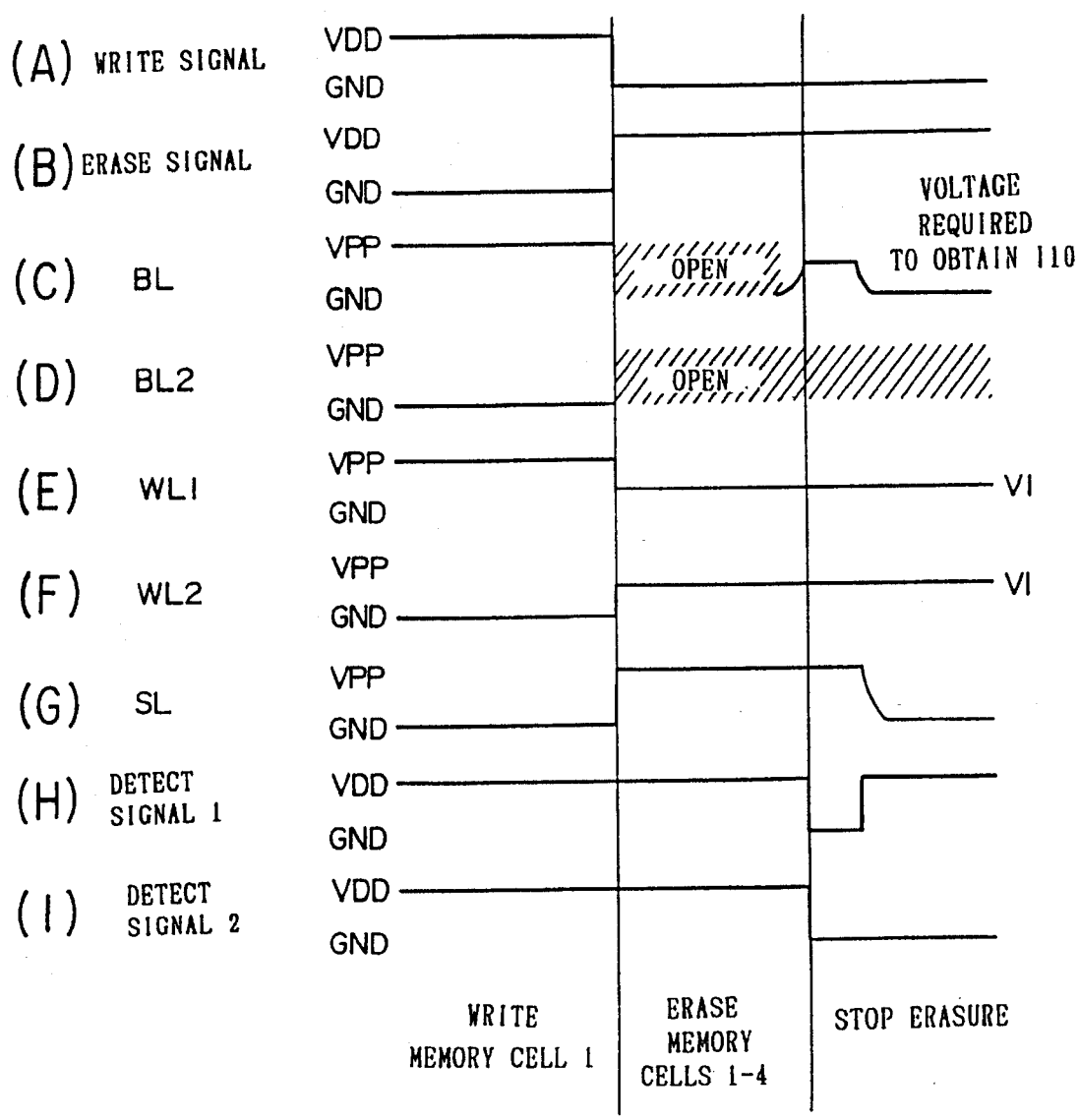

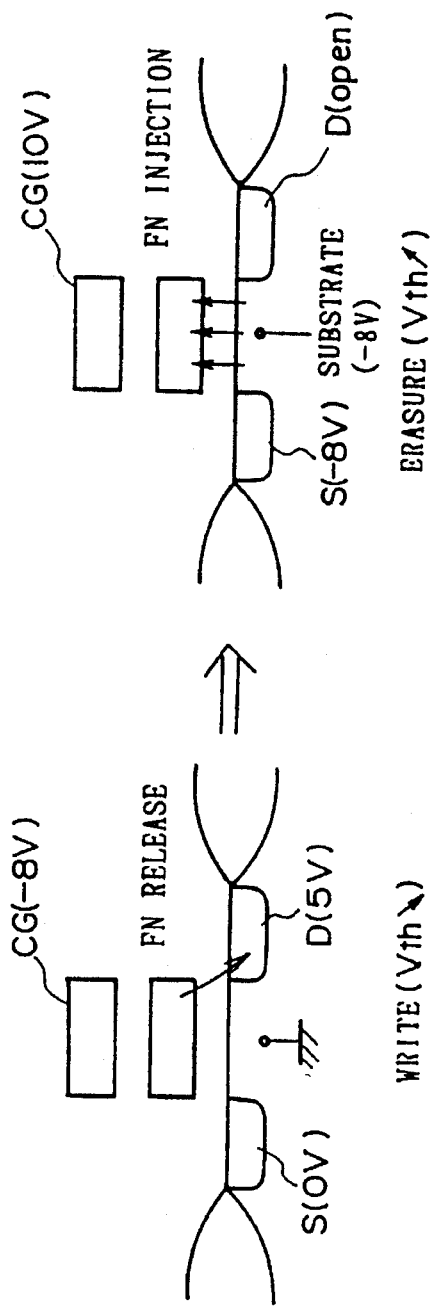
FIG. 8(A) WRITE (Vth↘)
FIG. 8(B) ERASURE (Vth↗)
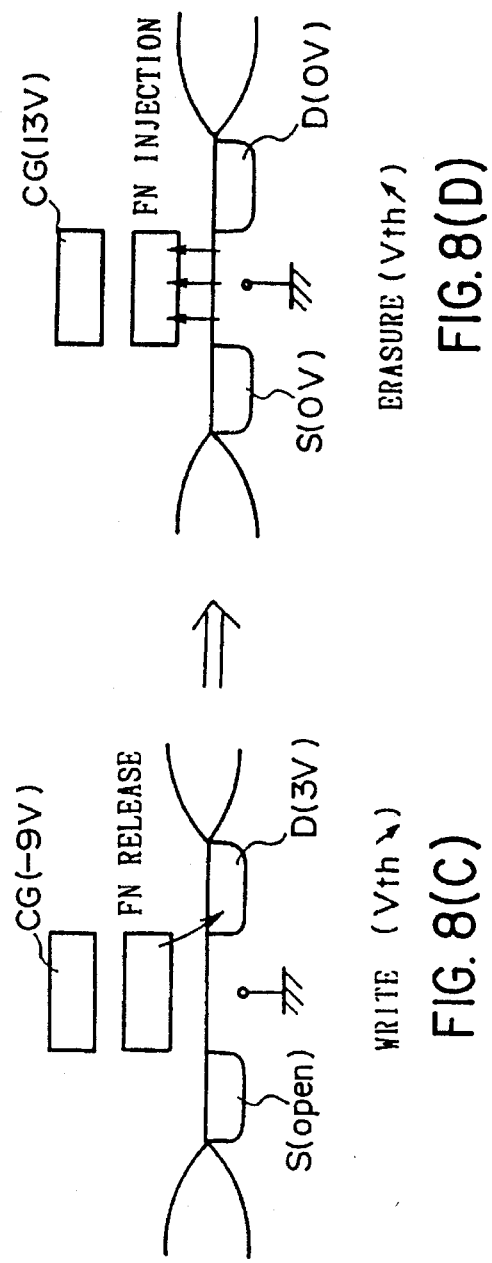
FIG. 8(C) WRITE (Vth↘)
FIG. 8(D) ERASURE (Vth↗)

NONVOLATILE SEMICONDUCTOR SYSTEM WITH AUTOMATIC OVER ERASE PROTECTION

BACKGROUND OF THE INVENTION

1. Field of the Invention

The present invention relates to a nonvolatile semiconductor system and particularly to a method of erasing a flash (entire array erasure type) EEPROM.

2. Technical Background

FIG. 9 shows a circuit diagram of a flash EEPROM constructed in accordance with the prior art. For simplicity, the flash EEPROM is assumed to be a four-memory-transistor structure. It comprises four memory transistors 1–4, an N-channel transistor 5, a P-channel transistor 6, an X-decoder circuit 118, a write/erase control circuit 119, an interface circuit 23 and an inverter circuit 30. The flash EEPROM also comprises an address buffer 92, a Y-decoder circuit 94, a sense amplifier 96 and a data buffer 98. The EEPROM further comprises bit lines BL1, BL2, word lines WL1, WL2 and a source line SL.

The interface circuit 28 functions to convert a fluctuation of input voltage at Vdd-GND into a fluctuation of output voltage at Vpp-GND.

Address signal is inputted into the X- and Y-decoders 118, 94 through the address buffer 92. Thus, the X-decoder 118 generates X-decode signals for the memory transistors and wordline signals to the word lines WL1 and WL2. On the other hand, the Y-decoder 94 generates Y-decode signals which are in turn supplied to the write/erase control circuit 119 and sense amplifier 96.

The write/erase control circuit 119 is responsive to the Y-decode signal to control the writing of data. More particularly, the write/erase control circuit 119 writes data signals inputted thereinto through the data buffer 98 into the memory transistors 1–4 using the Y-decode signals as addresses. The write/erase control circuit 119 can also erase the data stored in the memory transistor 1–4.

The sense amplifier 96 reads out the data stored in the memory transistors 1–4 using the Y-decode signals as addresses. The read data are then outputted, as data signals, from the sense amplifier 96 to any external unit through the data buffer 98.

The operation of such a prior art system will now be described with reference to FIG. 10 which illustrates the voltages at various different components.

As shown in FIG. 10, the writing to the memory transistor 1 is carried out when WL1 and BL1 are respectively in high-voltage Vpp level and WL2 and BL2 are respectively in GND level. When the erase signal is made L level (lower logical invert level), the N-channel transistor 5 is turned on and the P-channel transistor 6 is turned off. Thus, the source line SL becomes GND level to cause the memory transistor 1 to generate a channel current and also to generate hot electrons at the drain region edge thereof. The electrons are then injected into a floating gate electrode which in turn performs the writing operation. In this case, no writing operation will not be carried out in the other memory transistors 2–4 since no channel current is generated therein.

When the erasing operation is to be performed, as shown in FIG. 10, WL1 and WL2 are made GND level while BL1 and BL2 are made open level. Further, the erase signal is shifted to H level (upper logical invert level) so that the N-channel and P-channel transistors 5, 6 will be turned off and on, respectively. Thus, the source line SL becomes Vpp level so that tunnel current will be generated between the floating gate electrodes and the source region. Electrons are then released from the floating gate electrodes to the source region for erasing.

In the prior art, it is a highly technical problem that in the writing or erasing operation, the threshold voltage in a memory transistor must be limited within a proper range. For example, if the erasure is too much made, the release of electrons is too much made so that the threshold voltage in the memory transistor will be shifted to negative level. Even if only one memory transistor becomes such a depletion type by the overerasing, leak current will flow into a bit line connected to that memory transistor. As a result, it is impossible to read the memory transistor connected to this bit line.

Such a problem may be overcome by the use of a measure called "verifying operation". In the verifying operation, it is always monitored whether or not a memory transistor in question has sufficiently been erased. If it is judged that the memory transistor has sufficiently been erased, the erasing operation against that memory transistor will be terminated. If the memory transistor has not sufficiently been erased, the erasing operation against the memory transistor will be continued. However, the verifying operation increases the scale of the circuit and requires a complicated control for the circuit.

It is therefore an object of the present invention to prevent the aforementioned overerasing.

DISCLOSURE OF THE INVENTION

To this end, the present invention provides a nonvolatile semiconductor system comprising a memory transistor including a floating gate electrode, a control gate electrode and first and second diffusion layers, the memory transistor being adapted to store data by injecting electrons into and releasing electrons from the floating gate electrode, the improvements comprising means for applying a set voltage to the control gate electrode of said memory transistor on release of electrons, means for applying a voltage higher than the set voltage applied to said control gate electrode to the first diffusion layer of said memory transistor on release of electrons and means for detecting the threshold voltage in said memory transistor on release of electrons, said threshold voltage detecting means being adapted to detect the threshold voltage by applying a set voltage lower than the set voltage applied to said control gate electrode to the second diffusion layer of said memory transistor.

In accordance with the present invention, the set voltage lower than the set voltage applied to the control gate electrode is applied to the second diffusion layer through the threshold voltage detecting means when the electrons are released from the control gate electrode. If the release of electrons reduces the threshold voltage of the memory transistor to turn it on, the voltage in the first diffusion layer is pulled down toward said set voltage, resulting in stoppage of the electron release. In such a case, the overerasing can effectively be avoided since the set voltage is lower than the set voltage of the control gate electrode.

The threshold voltage detecting means of the present invention is of very simple structure since it is adapted to detect the threshold voltage by applying a set voltage to the second diffusion layer of the memory transistor. Even if such a threshold voltage detecting means is to be connected to each bit line, the threshold voltage detecting means can easily be placed within the minimum pitch between each pair of adjacent bit lines. As a result, the area of chip can be minimized even when the threshold voltage detecting means is added.

Since the threshold voltage detecting means provides the minimum circuitry functionally interposed from the detection of threshold voltage to the stoppage of electron release, time required to stop the electron release after detection can greatly be reduced, resulting in very superior sensitivity on detection.

The present invention also provides a nonvolatile semiconductor system comprising a memory transistor including a floating gate electrode, a control gate electrode and first and second diffusion layers, the memory transistor being adapted to store data by injecting electrons into and releasing electrons from said floating gate electrode, the improvements comprising means for applying a set voltage to the control gate electrode of said memory transistor on release of electrons, means for applying a voltage higher than the set voltage applied to said control gate electrode to the first diffusion layer of said memory transistor on release of electrons and means for detecting the threshold voltage in said memory transistor on release of electrons, said threshold voltage detecting means being adapted to detect the threshold voltage by detecting the voltage of the second diffusion layer in said memory transistor, based on the threshold voltage of a transistor having the same polarity as that of said memory transistor.

Similarly, the threshold detecting means of the present invention can avoid any overerasing by detecting the threshold voltage in the memory transistor.

The detection in the threshold detecting means is carried out by utilizing a transistor having the same polarity as that of the memory transistor to detect the voltage in the second diffusion layer. Thus, matching in the process can be maintained while providing a high-accuracy overerasing preventing means less depending on process fluctuation. As a result, the margin against the erase disturb and the like can be secured to improve the system in reliability and yield.

Moreover, the set voltage applied to the second diffusion layer may be set on the basis of the threshold voltage of a transistor having the same polarity as that of the memory transistor. As a result of this, the accuracy in the electron overerasing preventing means can more be increased less depending on process fluctuation.

The present invention further provides a nonvolatile semiconductor system comprising a memory transistor including a floating gate electrode, a control gate electrode and first and second diffusion layers, the memory transistor being adapted to store data by injecting electrons into and releasing electrons from said floating gate electrode, the improvements comprising means for applying a set voltage to the control gate electrode of said memory transistor on release of electrons, means for applying a voltage higher than the set voltage applied to said control gate electrode to the first diffusion layer of said memory transistor on release of electrons and means for detecting the threshold voltage in said memory transistor on release of electrons, said threshold voltage detecting means being adapted to detect the threshold voltage by detecting an electric current flowing between the first and second diffusion layers in said memory transistor, based on the threshold voltage in a transistor having the same polarity as that of said memory transistor.

Similarly, the threshold voltage detecting means can prevent the overerasing by detecting the threshold voltage in the memory transistor.

The detection in the threshold detecting means is carried out by utilizing a transistor having the same polarity as that of the memory transistor to detect the electric current flowing between the first and second diffusion layers. Thus, matching in the process can be maintained while providing a high-accuracy overerasing preventing means less depending on process fluctuation. By setting the set voltage applied to the second diffusion layer based on the threshold voltage in the transistor having the same polarity as that of the memory transistor, the accuracy in the overerasing preventing means can more be increased less depending on process fluctuation.

BRIEF DESCRIPTION OF THE DRAWINGS

FIG. 7 is a view illustrating voltages at various different parts in the third embodiment.

FIG. 8(A), 8(B), 8(C) and 8(D) are cross-sectional views of memory transistors for performing the other writing/erasing operations.

BEST MODE FOR CARRYING OUT THE INVENTION

As described, the object of the present invention is to prevent the overerasing in the memory transistor. To accomplish such an object, however, there exist five technical problems which will be described later. The first to third embodiments of the present invention are to overcome these technical problems.

First, the overerasing preventing means must have an accuracy increased as much as possible. Particularly, the overerasing preventing means should not be affected by process fluctuation. Even if the overerasing preventing means is disturbed by process fluctuation to provide only one memory transistor subjected to the overerasing, the normal operation in the circuit is no longer assured, resulting in very reduction on yield and the like.

Second, the circuitry of the overerasing preventing means should be simple as much as possible. In other words, the numbers of parts defining the circuit must be as few as possible. This is for the following reason. In such a type of memory, normally, memory cells are arranged to provide the minimum pitch between each pair of adjacent bit lines for such a purpose that the entire area of the memory is reduced.

When the overerasing preventing means is to be connected to each of the bit lines, the overerasing preventing means must be of a sufficiently small size to be placed within the minimum pitch range. If the circuit of the overerasing preventing means is complicated, however, it will hardly be placed within the minimum pitch range. In the worst case, the minimum pitch itself will have to be changed.

Third, the overerasing preventing means must operate as fast as possible. If time required to stop the erasing operation after detecting any overerasing is delayed, the memory transistor has already been placed in its over-erased condition when the erasing operation is stopped.

Finally, for the similar reason, the overerasing preventing means must have a sensitivity as high as possible.

The most preferred embodiments for overcoming these technical problems will be described below.

(1) First Embodiment

Figure 1:
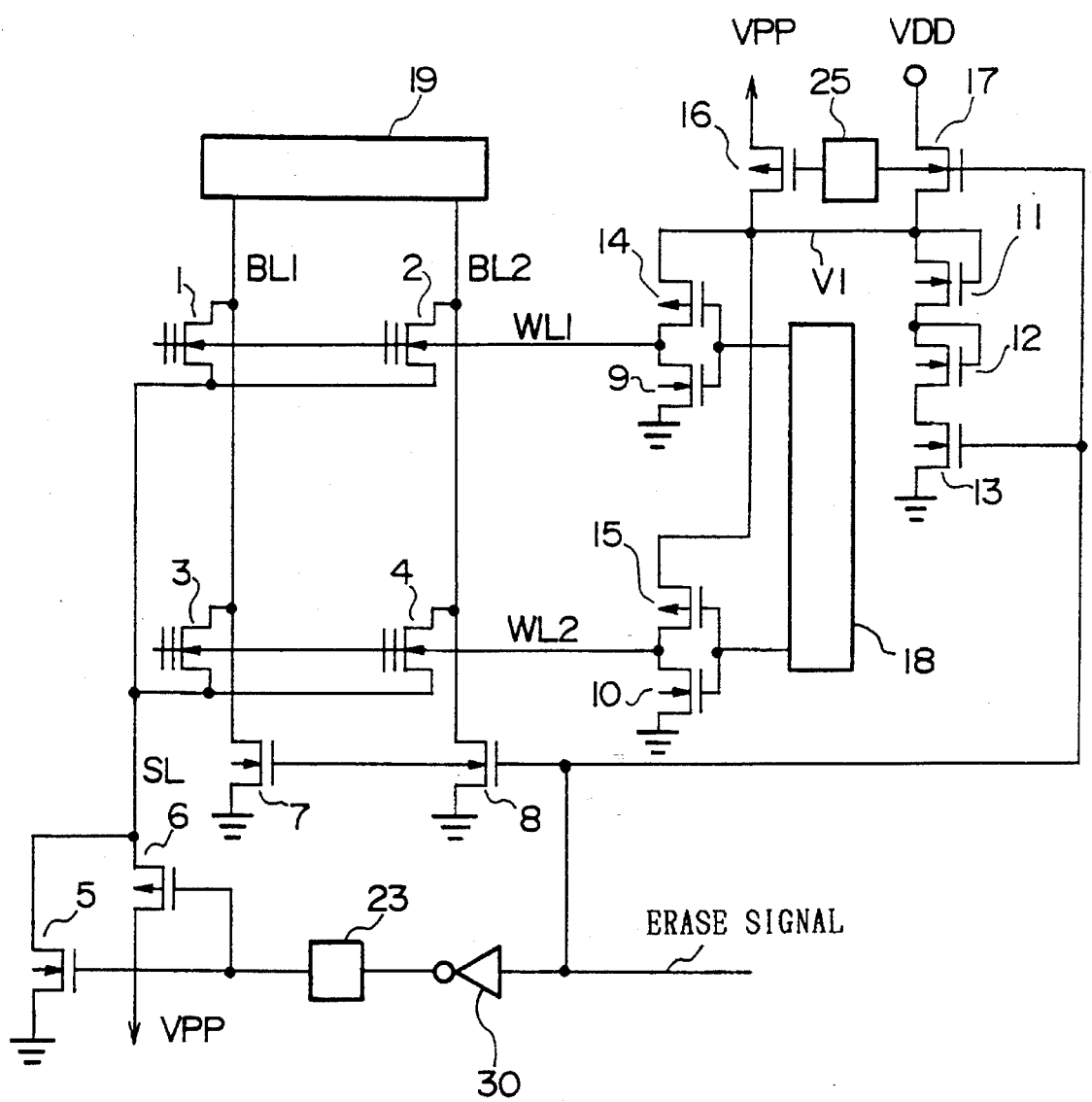
FIG. 1 is a circuit diagram of the first embodiment of a nonvolatile semiconductor system constructed in accordance with the present invention.

FIG. 1 shows a circuit diagram of the first embodiment of a nonvolatile semiconductor system constructed in accordance with the present invention. For simplicity, it is now assumed that the system is of a four-memory-transistor structure. Indeed, however, the memory unit of the first embodiment may be constructed by a matrix-like array consisting of a desired number of memory transistors. The nonvolatile semiconductor system comprises four transistors 1–4, N-channel transistors 5, 7–13 and 17, P-channel transistors 6 and 14–16, an X-decoder circuit 18, a write/erase control circuit 19, interface circuits 23 and 25 and an inverter circuit 80. Each of the interface circuits 28 and 25 functions to convert the fluctuation of input voltage at Vdd-GND into the fluctuation of output voltage at Vpp-GND. The system also comprises bit lines BL1 and BL2 respectively connected to the drain regions or second diffusion layers of the memory transistors 1–4, word lines WL1 and WL2 respectively connected to the control gate electrodes of the memory transistors 1–4, and a source line SL connected to the source regions or first diffusion layers of the memory transistors 1–4.

In the circuit of the first embodiment, the X-decoder circuit 18 and write/erase control circuit 19 function to write and read data relative to the matrix-like memory transistor array. In the circuit of the first embodiment, further, the erasing operation is carried out to the matrix-like memory transistor array by adding a high voltage through the P-channel transistor 6.

Figure 2:
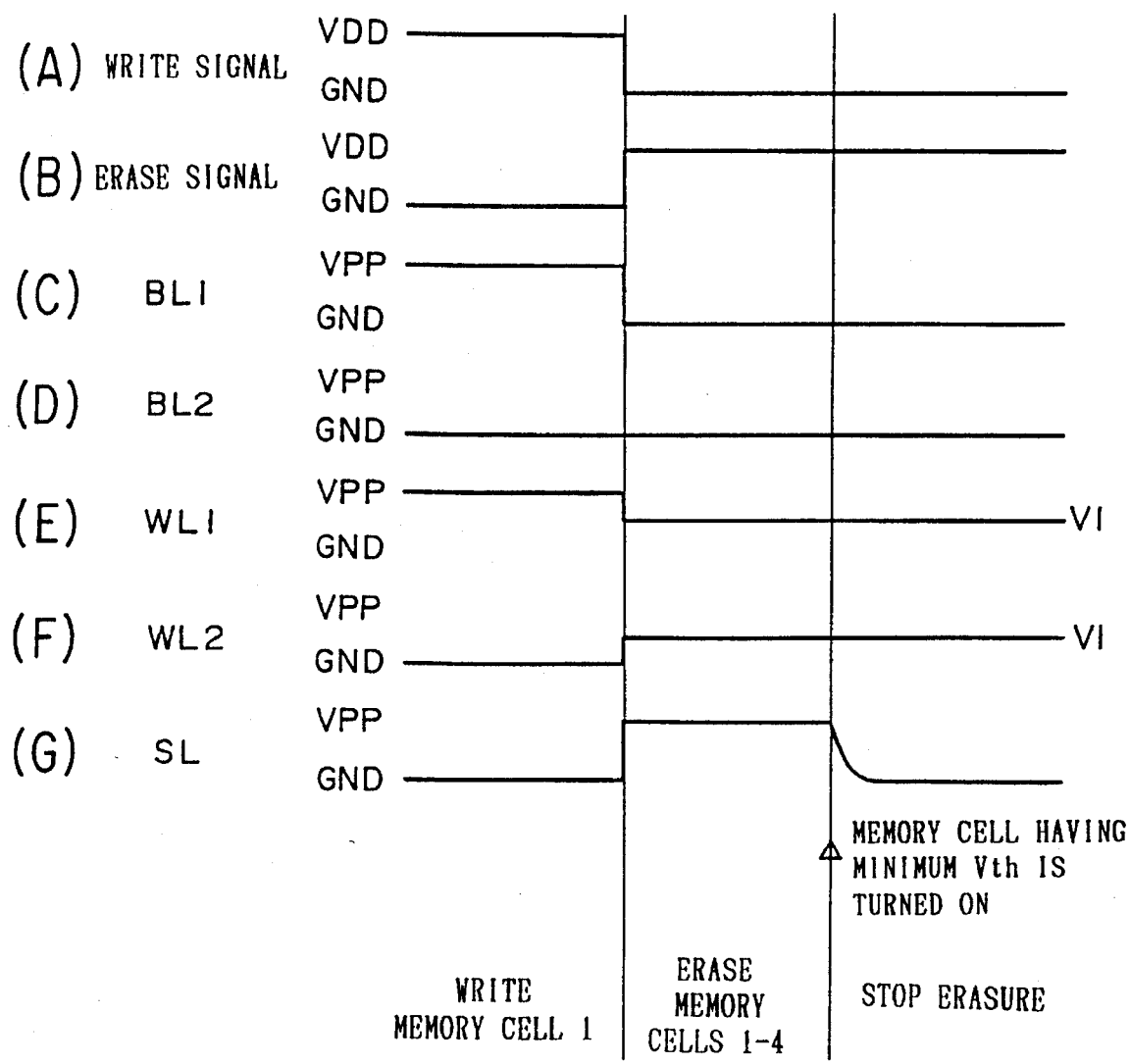
FIG. 2 is a view illustrating voltages at various different parts in the first embodiment.

The operation of the first embodiment will be described with reference to FIG. 2 which illustrates voltages at various different parts therein.

First, the writing operation will be described. As shown in FIG. 2, the writing operation can be carried out when the erase signal is made L level so that the transistors 5 and 16 are turned on and the transistors 6, 7, 8, 13 and 17 are turned off. Under such a situation, the following setting is performed when data is to be written in the memory transistor 1. As shown in FIG. 2, namely, the write/erase control circuit 19 makes the bit lines BL1 and BL2 Vpp and GND levels, respectively. The X-decoder circuit 18 makes the word lines WL1 and WL2 Vpp and GND levels, respectively. When such a setting is made, the voltages of the floating gate electrode and drain region only in the memory transistor 1 are simultaneously placed at Vpp level. As a result, a channel current is generated only in the memory transistor 1 which in turn generates hot electrons at the drain region edge thereof. Thus, the electrons are injected into the floating gate electrode. In such a manner, the writing operation will be carried out only to the memory transistor 1. On the other hand, the other memory transistors 2–4 will generate no channel current or not be written since the voltages of the control gate electrodes and drain regions are not simultaneously Vpp level.

Next, the erasing operation will be described. Prior to the erasing operation, the aforementioned writing operation has previously been carried out to the memory transistors 1–4. As shown in FIG. 2, the erase signal is then made H level so that the transistors 6, 7, 8, 13 and 17 are turned on and the transistors 5 and 16 are turned off. The bit lines BL1 and BL2 are further set at such a condition that no voltage is supplied through the write/erase control circuit 19, that is, at an open condition. Under such a situation, as shown in FIG. 2, the word lines WL1 and WL2 are set at a positive voltage V1 by the X-decoder circuit 18 such that a sufficient difference will exist between the Vpp voltage and the voltage V1. Thus, the control gate electrodes of the memory transistors 1–4 will have the voltage V1 while the source region will have the voltage Vpp. Consequently, a tunnel current will be created between the floating gate electrode and the source region in each memory transistor. As a result, electrons are released From the floating gate electrode to the source region to perform the erasing operation.

As the erasing operation proceeds, the threshold voltage Vth in each of the memory transistors 1–4 gradually decreases. It is now assumed that the voltage at the bit line BL1 or BL2 is V2 and that the increase of the threshold voltage associated with the body effect of the memory transistor is V3. As described, the voltage V1 has been applied to the control gate electrode of each of the memory transistors 1–4. Therefore, each memory transistor will be turned on when the threshold voltage Vth thereof becomes lower than the remainder of subtracting V2 and V3 from V1, that is, (V1–V2–V3). In such a case, the power-supply-ability of the transistor 6 has been set to be sufficiently lower than those of the other transistors 1–4, 7 and 8. When any one of the memory transistors 1–4 is turned on, the voltage in the source line SL is pulled down to GND level through the N-channel transistor 7 or 8, which are connected to the second diffusion regions of transistors 1–4 as shown in FIG. 2. As a result, the voltage at the source line SL is gradually lower level. As the voltage in the source line SL decreases, the tunnel current between the floating gate electrode and the source region in the memory transistor also decreases until the erasing operation is stopped.

In the first embodiment, it is considered that the voltages V2 and V3 is zero since the voltage V2 is sufficiently low. If the power-supply-ability of the N-channel transistors 11–13 are set to be sufficiently higher than that of the N-channel transistor 17, the voltage V1 can be set at a constant level (e.g. 1.5 V) without depending on the source voltage Vdd. Thus, the erasing operation will be stopped to prevent the overerasing when the threshold voltage Vth in the memory transistors becomes lower than 1.5 V.

In the first embodiment, the threshold voltage detecting means of each of the memory transistors 1–4 is realized by setting the drain voltage in that memory transistor at GND level on the erasing operation. For such a purpose, the first embodiment comprises N-channel transistors 7 and 8 each of which receives an erase signal at the gate electrode thereof. Thus, the threshold voltage detecting means in the first embodiment may be of very simple circuit. More particularly, a new circuit connected to each of the bit lines BL1 and BL2 to realize such a threshold voltage detecting means is only the N-channel transistor 7 or 8. Therefore, the threshold voltage detecting means can very easily be connected to each bit line in the memory cells within the minimum pitch range. Since only one N-channel transistor is required to be connected to each bit line, the area of chip will not substantially increase. For example, if the threshold voltage detecting means is defined by a sense amplifier or the like as in the prior art, the sense amplifiers comprising a plurality of transistors must be connected to all the bit lines. This would greatly increase the area of chip. In the worst case, the minimum pitch in the memory cells themselves may have to be changed. It will be apparent from the foregoing that the circuit of the first embodiment is effective for preventing a increase of the area of chip.

Furthermore, the threshold voltage detecting means is so constructed that immediately when any one of the memory transistors 1–4 is turned on, the source line SL is pulled down to GND level to stop the erasing operation. Therefore, the threshold voltage detecting means has such an advantage that time required to stop the erasing operation after the ON state of the memory transistor has been detected is very short. As a result, the overerasing can more positively be prevented to improve the margins on design and process very well. On the contrary, if the threshold voltage detecting means is defined by a sense amplifier comprising a plurality of transistors, the speed in operation will not be improved. This is because the system requires time to detect the threshold voltage, time to latch the detect signal, and time to stop the erasing operation at each of the memory transistors 1–4 after the latching step through some logic circuits.

The threshold voltage detecting means is adapted to reduce the voltage in the source line SL to stop the erasing operation at the same time when any one of the memory transistors 1–4 is turned on. This highly increases the sensitivity on detection. If multi-stage circuits such as sense amplifiers are used to detect that the memory transistors 1–4 are turned on, the sensitivity will be reduced by some range of threshold voltage in the transistors defining the circuit. On the contrary, the threshold voltage detecting means of the first embodiment may greatly be improved in sensitivity since the source line SL is pulled down to GND level immediately through the single stage memory transistor which is turned on.

In the first embodiment, the constant voltage V1 added to the control gate electrodes of the memory transistors 1–4 is generated by a constant voltage circuit which comprises N-channel transistors 11, 12, 13 and 17. Since the memory transistors 1–4 also are of N-type, matching in the process between the constant voltage circuit and the memory transistors 1–4 can be maintained. More particularly, even if the threshold voltage and the like are variable due to process fluctuation and the like, the influence thereof can be canceled to prevent the overerasing extremely accurately. Therefore, it can effectively be avoided that the overerasing preventing means does not properly function due to process fluctuation and the like.

Figure 3:
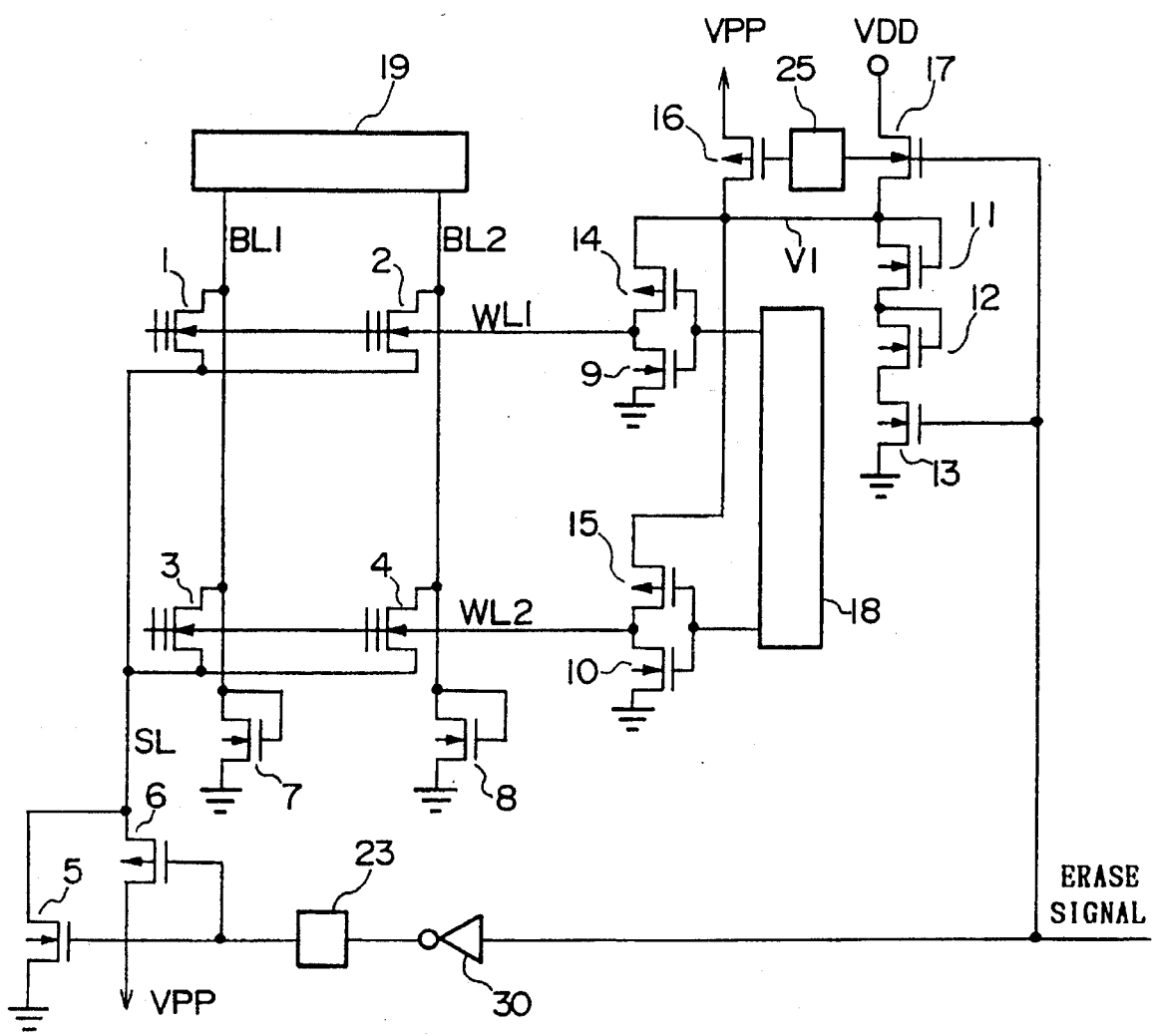
FIG. 3 is a diagram of a circuit for changing the voltage to be applied to the drain region of the memory transistor in the first embodiment.

Although the first embodiment has been described as to the threshold voltage detecting means used when GND voltage is applied to the drain regions of the memory transistors 1–4, the present invention is not limited to such an arrangement. The value of V2 is not necessarily required to be in GND level. If such a circuit as shown in FIG. 3, that is, a circuit in which the N-channel transistors 7 and 8 are connected as a diode to each other is used, the drain region of each of the memory transistors 1–4 will receives a voltage increased by the threshold voltage in that N-channel transistor. Since the value, Vth=V1−V2−V3, is thus reduced, the threshold voltage of the memory transistors required to stop the erasing operation may be set to be lower. Since no control by the erase signal is required, the circuit can be simplified. The increase in the threshold voltage of the memory transistors is determined on the threshold voltage in the N-channel transistors 7 and 8. Matching between the memory transistors 1–4 and the N-channel transistors 7, 8 all of which are of N-type can be maintained against process fluctuation. Consequently, the present invention can provide the threshold voltage detecting means which is more stable against process fluctuation.

(2) Second Embodiment

Figure 4:
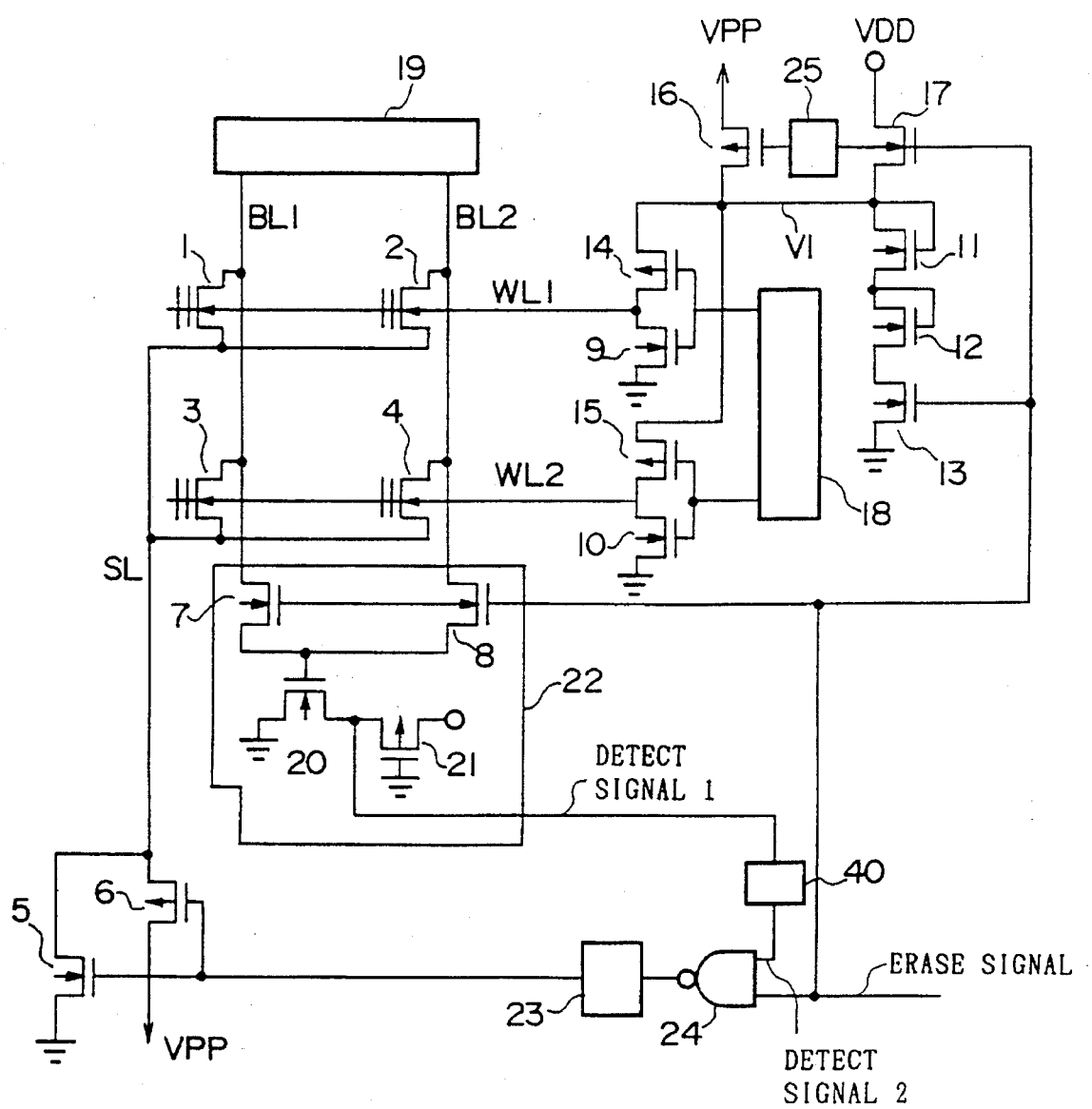
FIG. 4 is a circuit diagram of the second embodiment of a nonvolatile semiconductor system constructed in accordance with the present invention.

FIG. 4 shows a circuit diagram of the second embodiment of a nonvolatile semiconductor system constructed in accordance with the present invention. In this figure, parts similar to those of FIG. 1 are designated similar reference numerals. The nonvolatile semiconductor system comprises a voltage detecting circuit 22 which comprises N-channel transistors 7, 8 and 20 and a P-channel transistor 21; a NAND circuit 24; a latch circuit 40 for latching a detect signal 1 from the voltage detecting circuit 22 and for outputting the latched detect signal as a detect signal 2. The latch circuit 40 may be in the form of RS latch circuit. The operation of the second embodiment will be described with reference to FIG. 5 which illustrates voltages at various different parts therein.

Figure 5:
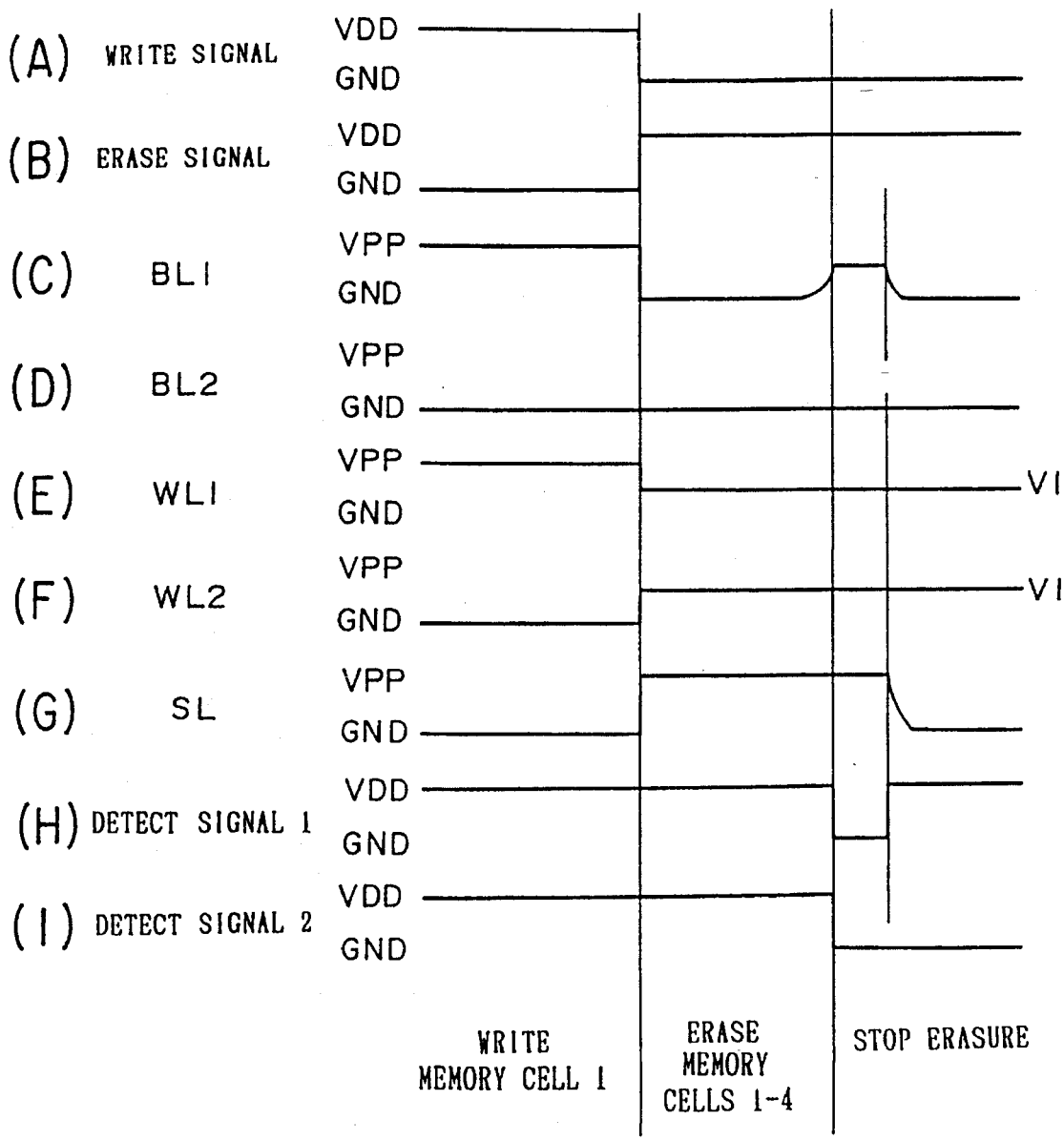
FIG. 5 is a view illustrating voltages at various different parts in the second embodiment.

As shown in FIG. 5, the writing operation can be carried out only when the erase signal is at L level, as in the first embodiment.

The erasing operation will be described. Prior to the erasing operation, the memory transistors 1–4 have previously be subjected to the aforementioned writing operation. When the erase signal is made H level as shown in FIG. 5, the transistors 7, 8, 13 and 17 are turned on and the transistor 16 is turned off. The bit lines BL1 and BL2 are set such that they are pulled down to GND level by a transistor having a very low power-supply ability which is located in the write/erase control circuit 19. Thus, the detect signal 1 from the voltage detecting circuit 22 is leveled up to H level by the P-channel transistor 21 and latched by the latch circuit 40 before it is outputted as the detect signal 2 which is at H level. As a result, the P-channel transistor 6 his turned on while the N-channel transistor 5 is turned off. Under such a condition, the word lines WL1 and WL2 are respectively set to be the positive voltage V1 by the X-decoder circuit 18 such that the difference between the voltages Vpp and V1 will be sufficient. Thus, the voltage in the control gate electrode of each of the memory transistors 1–4 becomes V1 level while the voltage in the source region becomes Vpp level. A tunnel current is generated between the floating gate electrode and the source region. As a result, electrons are released from the floating gate electrode to the source region to perform the erasing operation.

The latch circuit 40, which may be in the form of RS latch circuit, is reset to output the detect signal 2 of L level when the detect signal 1 becomes L level. On the writing operation, the latch circuit 40 is set to output the detect signal 2 of H level.

As the erasure proceeds to reduce the threshold voltage Vth of the memory transistor to a sufficiently low level, any one of the memory transistors will be turned on. It is now assumed that a memory transistor having its minimum threshold voltage Vth is connected to the bit line BL1 through the drain region or the second diffusion layer. When this memory transistor is turned on, the voltage in the bit line BL1 is pulled up toward Vpp level through the P-channel transistor 6 to increase the voltage V2 in the BL1, as shown in FIG. 5. If the power-supply ability of the N-channel transistor 20 is set to be sufficiently higher than that of the P-channel transistor 21, the detect signal 1 from the voltage detecting circuit 22 is switched to L level immediately when the voltage V2 becomes equal to a set voltage V20, as shown in FIG. 5. The switched detect signal is latched by the latch circuit 40 to output the detect signal 2 of L level. As a result, the P-channel transistor 6 is turned off and the N-channel transistor 5 is turned on. As shown in FIG. 5, the voltage in the source line SL is shifted to GND level to stop the erasing operation.

If it is assumed that the increase in the threshold voltage associated with the body effect of the memory transistor is V3, the lower limit of the threshold voltage Vth in the memory transistor becomes equal to (V1−V20−V3). In the second embodiment, the power-supply-ability of the N-channel transistors 11–13 are set to be sufficiently higher than that of the N-channel transistor 17. Thus, the voltage V1 can be set to be at a constant level, for example, at 2.0 V, without depending on the power voltage Vdd. If the voltage V20 is set to be equal to 1.0 V, the voltage V3 becomes equal to about 0.2 V. Therefore, the lower limit of the threshold voltage in the memory transistor will be equal to 0.8 V=2.0 V−1.0 V−0.2 V. As a result, the threshold voltage will not become negative. In other words, the overerasing will not be carried out.

In the voltage detecting circuit 22 of the second embodiment, the detection of the threshold voltage in the memory transistors 1–4 is performed by utilizing the threshold voltage in the N-channel transistor 20. This N-channel transistor 20 is of N-type as in the memory transistor 1–4. Matching in the process and the like can be maintained. For example, if the threshold voltage of the memory transistor increases, the threshold voltage of the N-channel transistor also increases. As a result, the present invention can provide a overerasing preventing circuit having an improved accuracy, less depending on process fluctuation.

Moreover, the constant voltage V1 added to the control gate electrode of each of the memory transistors 1–4 is generated by a constant voltage circuit which comprises N-channel transistors 11, 12, 13 and 17. Since these memory transistors 1–4 also are of N-type, matching in the process between the constant voltage circuit and the memory transistors 1–4 is maintained. As a result of this, thus, the accuracy in the overerasing preventing means can more be increased less depending on process fluctuation.

Although the second embodiment has been described as to the detect signal 2 used directly as a source voltage control signal, a person skilled in the art can easily understand that the same advantage as in the second embodiment can be obtained even if the detect signal 2 is used as a monitor signal for preventing the overerasing. For example, a circuit arrangement can be provided which is adapted to input the detect signal 2 into a microcomputer (not shown) for controlling the entire memory circuit, the microcomputer being adapted to monitor and control the detect signal 2. If there is an overerasing, the microcomputer generates a stop signal used to stop the erasing operation. In such a circuit arrangement, the microcomputer judges whether or not the memory circuit expires its life when the overerasing is frequently produced. It may be warned to the user.

(3) Third Embodiment

Figure 6:
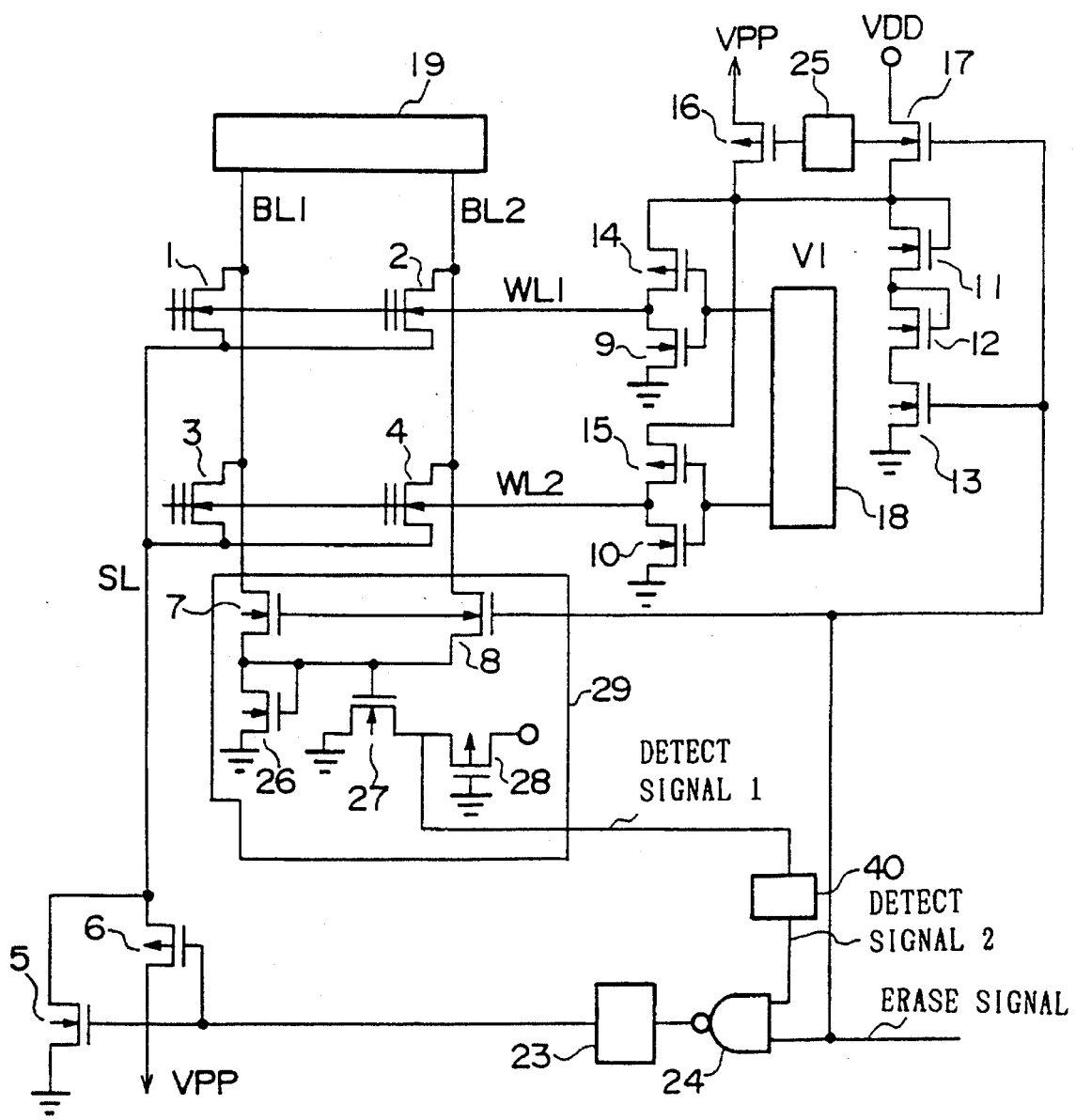
FIG. 6 is a circuit diagram of the third embodiment of a nonvolatile semiconductor system constructed in accordance with the present invention.
Figure 9:
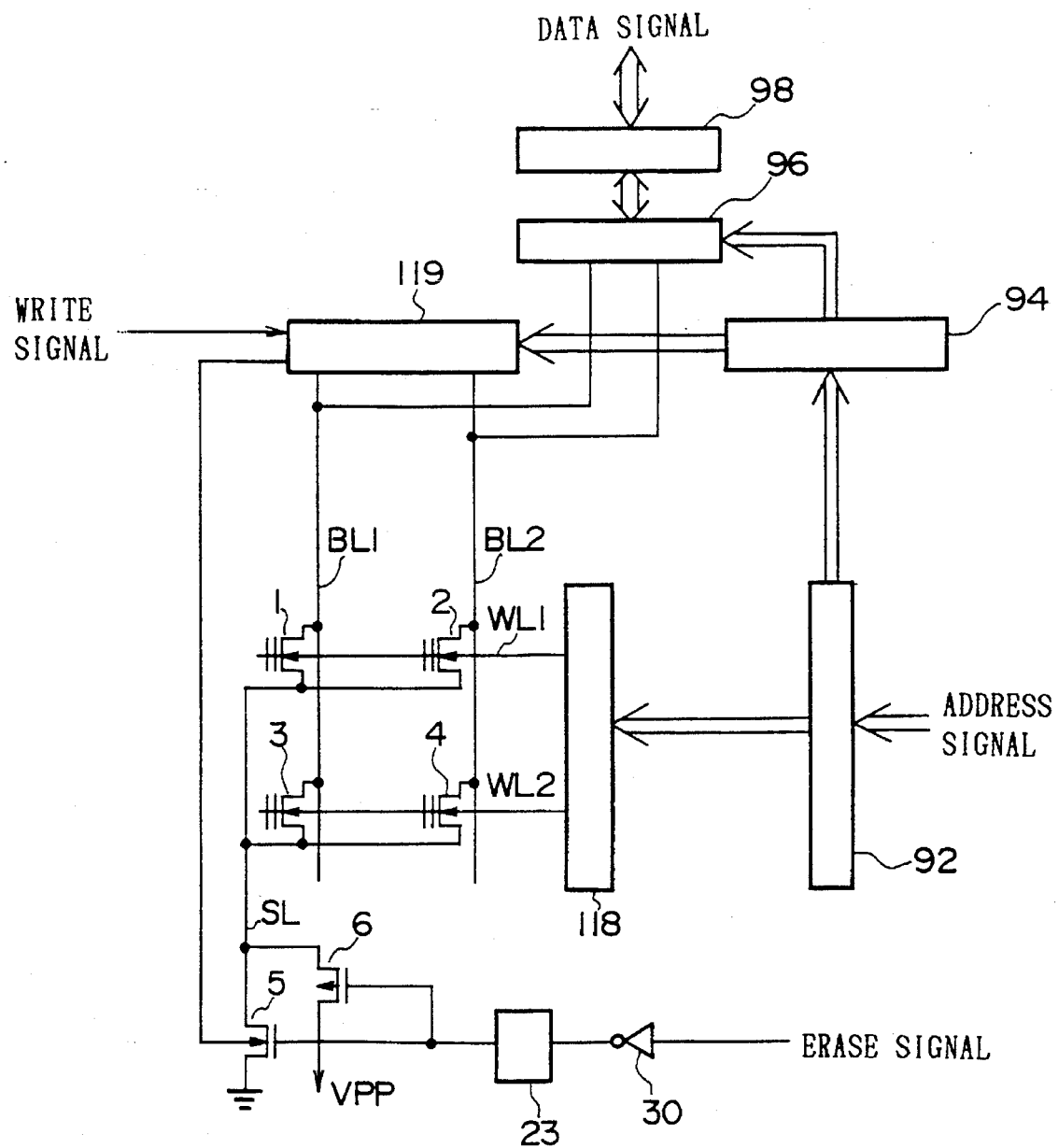
FIG. 9 is a circuit diagram of a nonvolatile semiconductor system constructed in accordance with the prior art.
Figure 10:
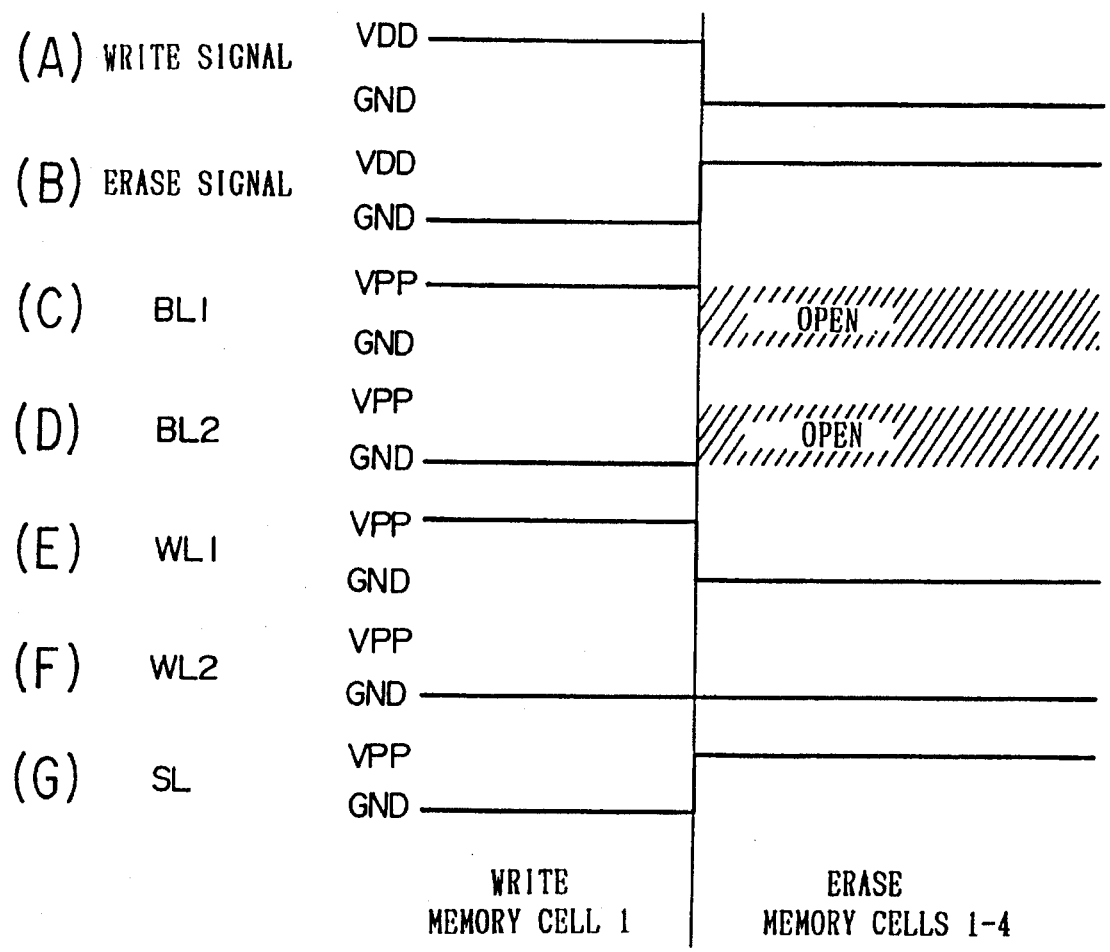
FIG. 10 is a view illustrating voltages at various different parts in the prior art.

FIG. 6 shows a circuit diagram or the third embodiment of a nonvolatile semiconductor system constructed in accordance with the present invention. In the third embodiment, parts similar to those shown in FIG. 4 are designated by similar reference numerals. The nonvolatile semiconductor system comprises a current detecting circuit 29 which comprises N-channel transistors 7, 8, 26 and 27 and a P-channel transistors 28. The operation of the third embodiment will be described with reference to FIG. 7 which illustrates voltages at various different parts therein.

As shown in FIG. 7, the writing operation can be carried out only when the erase signal is made L level, as in the first embodiment.

The erasing operation will be described. Prior to the erasing operation, the memory transistors 1–4 have previously been subjected to the aforementioned writing operation, as in the previous embodiments. As shown in FIG. 7, the erase signal is then made H level, so that the transistors 7, 8, 13 and 17 are turned on and the transistor 16 is turned off. The write/erase control circuit 19 is set at such a condition that no voltage is supplied to the bit lines BL1 and BL2, that is, at an open state. If such a setting is made, the detect signal 1 in the current detecting circuit 29 is pulled up to High level by the P-channel transistor 21 and latched by the latch circuit 40 before it is outputted as a detect signal 2 of H level. As a result, the P-channel transistor 6 is turned on and the N-channel transistor 5 is turned off. Under such a situation, as shown in FIG. 7, the word lines WL1 and WL2 are respectively set to be in a positive voltage V1 by the X-decoder circuit 18 such that a sufficient difference will be between the voltages Vdd and V1. Thus, the voltages at the Floating gate electrodes off the memory transistors 1–4 become V1 while the voltages at the source regions thereof become Vpp level. Therefore, a tunnel current is produced between the floating gate electrode and the source region in each of the memory transistors 1–4. As a result, electrons are released from the floating gate electrode to the source region to perform the erasing operation.

As the erasure proceeds to reduce the threshold voltage Vth in the memory transistors to a sufficiently low level, any one of the memory transistors is turned on. For example, if a memory cell having the minimum threshold voltage Vth is connected to the bit line BL1, an electric current I1 flows from the source line SL to the bit line BL1 to increase the voltage in the bit line BL1, as shown in FIG. 7. The source line SL is connected to the source region or first diffusion regions of the memory transistors 1–4. The bit lines BL1 and BL2 are connected to the drain regions or second diffusion regions of the memory transistors. If the power-supply-ability of the N-channel transistors 26 and 27 are set to be sufficiently higher than that of the P-channel transistor 28, the detect signal 1 at the current detecting circuit 29 is shifted to L level as the current I1 reaches a set current I10, as shown in FIG. 7. The shifted detect signal 1 is latched by the latch circuit 40 which in turn outputs a detect signal 2 of L level. As a result, the P-channel transistor 6 is turned off while the N-channel transistor 5 is turned on. Thus, the voltage at the source line SL becomes GND level to stop the erasing operation.

As in the second embodiment, if the voltage V1 is set to be a properly positive value, the current begins to flow before the threshold voltage becomes negative. The flow of the current will be detected to prevent the overerasing.

As in the second embodiment, a circuit for generating a constant voltage V1 and the current detecting circuit 29 in the third embodiment are defined by N-channel transistors 26, 27, 17, 11, 12 and 13. Matching in the process to the memory transistors 1–4 which are similarly of N-type can be maintained to provide an overerasing preventing circuit having an improved accuracy, less depending on process fluctuation. If the current is detected by utilizing resistors, capacitors and the like, such matching will not be maintained. In such a sense, the third embodiment has a very high advantage. Such an advantage can further be improved by providing a circuit which is also defined by N-channel transistors and generates the constant voltage V1.

Although the third embodiment has been described as to the detect signal used directly as a source voltage control signal, a person skilled in the art can easily understand that the detect signal may be used as a monitor signal for preventing the overerasing to obtain the same advantages as in the previous embodiments. Of course, although for this embodiment the first and second diffusion regions are the source and drains, respectively, of the memory transistors 1–4, it is appreciated that the first and second diffusion regions can also be the drains and sources, respectively, of the memory transistors 1–4.

The present invention is not limited to the aforementioned embodiment, but may similarly be applied in various modifications and changes without departing from the concept of the invention.

Although the third embodiment has been described as to the writing operation in which hot electrons are injected into the floating gate electrodes and the erasing operation in which electrons are released through the tunnel current, the invention is not limited to these operational modes. The present invention may be applied to any memory cell if it can regulate the threshold voltage at least by releasing and injecting electrons relative to the floating gate electrodes, irrespectively of the hot electrons or tunnel current. In either of the writing or erasing operation, the electrons may be released from and injected into any one of the drain region, source region and semiconductor substrate. Therefore, the present invention may be applied to such memory cells as shown in FIGS. 8A and 8B or FIGS. 8C and 8D. In FIGS. 8A and 8C, a tunnel current causes electrons to be released to the drain region to perform the writing operation. In FIGS. 8B and 8D, the erasing operation is carried out by injecting electrons from the semiconductor substrate through the tunnel current.

I claim:

1. A nonvolatile semiconductor system comprising a memory transistor including a floating gate electrode, a control gate electrode and first and second diffusion layers, the memory transistor storing data by one of injecting electrons into said floating gate electrode and releasing electrons from said floating gate electrode, the nonvolatile semiconductor system comprising:

first voltage applying means for applying a first voltage to the control gate electrode of said memory transistor during an electron release;

second voltage applying means for applying a second voltage to the first diffusion layer of said memory transistor during said electron release, the second voltage being higher than the first voltage; and third voltage applying means for applying a third voltage to the second diffusion layer of said memory transistor during said electron release, the third voltage being lower than the first voltage, wherein the memory transistor is placed in a conducting state to reduce the second voltage applied to the first diffusion layer to a low level so that said electron release in the memory transistor is stopped when a threshold voltage of the memory transistor becomes lower than a set level based on the first and third voltages applied to the control electrode and the second diffusion layer, respectively, of the memory transistor.

2. A nonvolatile semiconductor system as defined in claim 1, wherein the first voltage is set based on a threshold voltage in at least one other transistor of the nonvolatile semiconductor having a same polarity as a polarity of said memory transistor.

3. A nonvolatile semiconductor system as defined in claim 1, wherein the third voltage is set based on a threshold voltage in at least one other transistor of the nonvolatile semiconductor system having a same polarity as a polarity of said memory transistor.

4. A nonvolatile semiconductor system as defined in claim 2, wherein the third voltage is set based on a threshold voltage in at least one other transistor of the nonvolatile semiconductor system having a same polarity as a polarity of said memory transistor.

5. A nonvolatile semiconductor system comprising a memory transistor including a floating gate electrode, a control gate electrode and first and second diffusion layers, the memory transistor storing data by one of injecting electrons into said floating gate electrode and releasing electrons from said floating gate electrode, the nonvolatile semiconductor system comprising:

first voltage applying means for applying a first voltage to the control gate electrode of said memory transistor during an electron release, the first voltage applied to said control gate electrode being based on a threshold voltage of at least one other transistor of the nonvolatile semiconductor system having a same polarity as the polarity of said memory transistor;

second voltage applying means for applying a second voltage to the first diffusion layer of said memory transistor during said electron release, the second voltage being higher than the first voltage;

third voltage applying means for applying a third voltage to the second diffusion layer of said memory transistor during said electron release, the third voltage being lower than the first voltage; and electron release stopping means for stopping said electron release in said memory transistor in response to a voltage of the second diffusion layer in said memory transistor, said voltage being set when said memory transistor is in a conducting state.

6. A nonvolatile semiconductor system comprising a memory transistor including a floating gate electrode, a control gate electrode and first and second diffusion layers, the memory transistor storing data by one of injecting electrons into said floating gate electrode and releasing electrons from said floating gate electrode, the nonvolatile semiconductor system comprising:

first voltage applying means for applying a first voltage to the control gate electrode of said memory transistor during an electron release, the first voltage applied to said control gate electrode being set based on a threshold voltage of at least one other transistor having a same polarity as that of said memory transistor;

second voltage applying means for applying a second voltage to the first diffusion layer of said memory transistor during said electron release, said second voltage being higher than the first voltage; and electron release stopping means for stopping said electron release by detecting an electric current flowing between the first and second diffusion layers in said memory transistor when a threshold voltage of said memory transistor decreases below a set voltage placing the memory transistor in a conducting state, said set voltage being based on the first voltage.

7. A nonvolatile semiconductor system as defined in claim 5, wherein said electron release stopping means stops the electron release by stopping the application of the second voltage.

8. A nonvolatile semiconductor system as defined in claim 7, wherein said electron release stopping means stops the application of the second voltage to a plurality of memory transistors including said memory transistor.

9. A nonvolatile semiconductor system as defined in claim 6, wherein said electron release stopping means stops the electron release by stopping the application of the second voltage.

10. A nonvolatile semiconductor system as defined in claim 9, wherein said electron release stopping means stops the application of the second voltage to a plurality of memory transistors including said memory transistor.

11. A nonvolatile semiconductor system as defined in claim 6, wherein the second diffusion layer is connected to a control line and a current detection line, said control line being placed in a high impedance state during said electron release, said electron release stopping means stopping the electron release in response to an electric current flowing through said current detection line.

12. A nonvolatile semiconductor system comprising a memory transistor including a floating gate electrode, a control gate electrode and first and second diffusion layers, the memory transistor storing data by one of injecting electrons into said floating gate electrode and releasing electrons from said floating gate electrode, the nonvolatile semiconductor system comprising:

first voltage applying means for applying a first voltage to the control gate electrode of said memory transistor during an electron release;

second voltage applying means for applying a second voltage to the first diffusion layer of said memory transistor during said electron release, the second voltage being higher than the first voltage; and third voltage applying means for applying a third voltage to the second diffusion layer through a transistor having the same polarity as the memory transistor and being diode-connected to the memory transistor, the third voltage being lower than the first voltage, wherein the memory transistor is placed in a conducting state to reduce the second voltage applied to the first diffusion layer to a low level so that the electron release in the memory transistor is stopped when a threshold voltage of the memory transistor becomes lower than a set level based on the first and third voltages applied to the control electrode and the second diffusion layer, respectively, of the memory transistor.

13. A nonvolatile semiconductor system comprising a memory transistor including a floating gate electrode, a control gate electrode and first and second diffusion layers, the memory transistor storing data by one of injecting electrons into said floating gate electrode and releasing electrons from said floating gate electrode, the nonvolatile semiconductor system comprising:

first voltage applying means for applying a first voltage to the control gate electrode of said memory transistor during an electron release, the first voltage applied to said control gate electrode being based on a threshold voltage of at least one other transistor of the nonvolatile semiconductor system having a same polarity as the polarity of said memory transistor;

second voltage applying means for applying a second voltage to the first diffusion layer of said memory transistor during said electron release, the second voltage being higher than the first voltage;

third voltage applying means for applying a third voltage to the second diffusion layer of said memory transistor during electron release, the third voltage being lower than the first voltage; and detection means for detecting a voltage of the second diffusion layer in said memory transistor and for generating a detection signal, wherein said electron release is stopped in response to said detection signal generated by said detection means.

14. A nonvolatile semiconductor system comprising a memory transistor including a floating gate electrode, a control gate electrode and first and second diffusion layers, the memory transistor storing data by one of injecting electrons into said floating gate electrode and releasing electrons from said floating gate electrode, the nonvolatile semiconductor system comprising:

first voltage applying means for applying a first voltage to the control gate electrode of said memory transistor during an electron release, the first voltage applied to said control gate electrode being based on a threshold voltage of at least one other transistor of the nonvolatile semiconductor system having a same polarity as the polarity of said memory transistor;

second voltage applying means for applying a second voltage to the first diffusion layer of said memory transistor during said electron release, said second voltage being higher than the first voltage; and detection means for detecting an electric current flowing between the first and second diffusion layers in said memory transistor and for generating a detection signal, said electric current flowing when a threshold voltage of the memory transistor decreases below a set voltage, wherein the electron release is stopped in response to said detection signal generated by said detection means, said set voltage being based on the first voltage.

15. A nonvolatile semiconductor system comprising a plurality of memory transistors, each of the plurality of memory transistors including a floating gate electrode, a control gate electrode and first and second diffusion layers, each of the plurality of memory transistors storing data by one of injecting electrons into said floating gate electrode and releasing electrons from said floating gate electrode, the nonvolatile semiconductor system comprising:

first voltage applying means for applying a first voltage to the control gate electrode of each of said plurality of memory transistors during an electron release;

second voltage applying means for applying a second voltage to the first diffusion layer of each of said plurality of memory transistors during said electron release, the second voltage being higher than the first voltage; and third voltage applying means for applying a third voltage to the second diffusion layer of each of said plurality of memory transistors, the third voltage being lower than the first voltage, wherein one of the plurality of memory transistors is placed in a conducting state to reduce the second voltage applied to the first diffusion layers of the plurality of memory transistors to a low level so that said electron release in the plurality of memory transistors is stopped when a threshold voltage of the one of the plurality of memory transistors becomes lower than a set level based on the first and third voltages applied to the control electrode and the second diffusion layer, respectively, of the one of the plurality of memory transistors.

* * * * *